(12) United States Patent
Dias et al.

(10) Patent No.: US 10,763,220 B2
(45) Date of Patent: *Sep. 1, 2020

(54) SYSTEMS AND METHODS FOR ELECTROMAGNETIC INTERFERENCE SHIELDING

(71) Applicant: Intel Corporation, Santa Clara, CA (US)

(72) Inventors: Rajendra C. Dias, Phoenix, AZ (US); Mitul B. Modi, Phoenix, AZ (US)

(73) Assignee: Intel Corporation, Santa Clara, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 16/256,338

(22) Filed: Jan. 24, 2019

(65) Prior Publication Data

US 2019/0157215 A1 May 23, 2019

Related U.S. Application Data

(63) Continuation of application No. 15/087,270, filed on Mar. 31, 2016, now Pat. No. 10,229,887.

(51) Int. Cl.
*H01L 23/552* (2006.01)
*H01L 23/00* (2006.01)
(Continued)

(52) U.S. Cl.
CPC ........ *H01L 23/552* (2013.01); *H01L 21/2855* (2013.01); *H01L 21/6835* (2013.01); *H01L 21/78* (2013.01); *H01L 21/784* (2013.01); *H01L 23/295* (2013.01); *H01L 23/3114* (2013.01); *H01L 23/3121* (2013.01);
(Continued)

(58) Field of Classification Search
CPC ..................................................... H01L 23/552
See application file for complete search history.

(56) References Cited

U.S. PATENT DOCUMENTS 10,229,887 B2   3/2019  Dias et al.
2005/0259706 A1  11/2005  Zhang
(Continued)

FOREIGN PATENT DOCUMENTS

KR    1020130035620 A    4/2013
WO    WO-2017172161 A1   10/2017

OTHER PUBLICATIONS

"U.S. Appl. No. 15/087,270, Advisory Action dated Aug. 10, 2017", 4 pgs.

(Continued)

*Primary Examiner* — Vongsavanh Sengdara
(74) *Attorney, Agent, or Firm* — Schwegman Lundberg & Woessner, P.A.

(57) ABSTRACT

Discussed generally herein are methods and devices including or providing an electromagnetic interference (EMI) shielding. A device can include substrate including electrical connection circuitry therein, ground circuitry on, or at least partially in the substrate, the ground circuitry at least partially exposed by a surface of the substrate, a die electrically connected to the connection circuitry and the ground circuitry, the die on the substrate, a conductive material on a die backside, and a conductive paste or one or more wires electrically connected to the ground circuitry and the conductive material.

20 Claims, 12 Drawing Sheets

(51) Int. Cl.
*H01L 21/285* (2006.01)
*H01L 23/31* (2006.01)
*H01L 21/78* (2006.01)
*H01L 23/544* (2006.01)
*H01L 23/29* (2006.01)
*H01L 21/683* (2006.01)
*H01L 21/784* (2006.01)
*H01L 21/56* (2006.01)

(52) U.S. Cl.
CPC ............ *H01L 23/544* (2013.01); *H01L 24/17* (2013.01); *H01L 24/49* (2013.01); *H01L 24/73* (2013.01); *H01L 24/81* (2013.01); *H01L 24/85* (2013.01); *H01L 24/92* (2013.01); *H01L 24/94* (2013.01); *H01L 24/96* (2013.01); *H01L 24/97* (2013.01); *H01L 21/561* (2013.01); *H01L 21/568* (2013.01); *H01L 24/32* (2013.01); *H01L 24/48* (2013.01); *H01L 24/83* (2013.01); *H01L 2221/6834* (2013.01); *H01L 2221/68327* (2013.01); *H01L 2223/5446* (2013.01); *H01L 2223/54426* (2013.01); *H01L 2224/16225* (2013.01); *H01L 2224/16227* (2013.01); *H01L 2224/32225* (2013.01); *H01L 2224/32245* (2013.01); *H01L 2224/48091* (2013.01); *H01L 2224/48106* (2013.01); *H01L 2224/48227* (2013.01); *H01L 2224/73153* (2013.01); *H01L 2224/73204* (2013.01); *H01L 2224/73253* (2013.01); *H01L 2224/73257* (2013.01); *H01L 2224/73265* (2013.01); *H01L 2224/83005* (2013.01); *H01L 2224/92125* (2013.01); *H01L 2224/92227* (2013.01); *H01L 2224/94* (2013.01); *H01L 2224/97* (2013.01); *H01L 2924/00014* (2013.01); *H01L 2924/0105* (2013.01); *H01L 2924/01013* (2013.01); *H01L 2924/01022* (2013.01); *H01L 2924/01023* (2013.01); *H01L 2924/01024* (2013.01); *H01L 2924/01027* (2013.01); *H01L 2924/01028* (2013.01); *H01L 2924/01029* (2013.01); *H01L 2924/01046* (2013.01); *H01L 2924/01047* (2013.01); *H01L 2924/01074* (2013.01); *H01L 2924/01078* (2013.01); *H01L 2924/01079* (2013.01); *H01L 2924/10155* (2013.01); *H01L 2924/14* (2013.01); *H01L 2924/19107* (2013.01); *H01L 2924/3025* (2013.01); *H01L 2924/3511* (2013.01)

(56) References Cited

U.S. PATENT DOCUMENTS

| | | | |
|---|---|---|---|
| 2007/0176281 A1* | 8/2007 | Kim | H01L 24/97 257/700 |
| 2008/0308912 A1* | 12/2008 | Cha | H01L 23/552 257/659 |
| 2009/0096076 A1* | 4/2009 | Jung | H01L 25/0657 257/686 |
| 2011/0111562 A1 | 5/2011 | San Antonio et al. | |
| 2012/0086108 A1 | 4/2012 | Wu | |
| 2012/0119346 A1* | 5/2012 | Im | H01L 23/552 257/690 |
| 2012/0188727 A1 | 7/2012 | Lin et al. | |
| 2012/0273926 A1 | 11/2012 | Pagaila | |
| 2013/0020685 A1* | 1/2013 | Kwak | H01L 23/552 257/659 |
| 2013/0093067 A1 | 4/2013 | Clark et al. | |
| 2014/0291821 A1* | 10/2014 | Song | H01L 24/24 257/659 |
| 2015/0130053 A1 | 5/2015 | Hara et al. | |
| 2015/0179588 A1* | 6/2015 | Choi | H01L 23/552 257/659 |
| 2017/0287846 A1 | 10/2017 | Dias et al. | |

OTHER PUBLICATIONS

"U.S. Appl. No. 15/087,270, Examiner Interview Summary dated Apr. 6, 2017", 3 pgs.
"U.S. Appl. No. 15/087,270, Examiner Interview Summary dated Jul. 24, 2017", 3 pgs.
"U.S. Appl. No. 15/087,270, Examiner Interview Summary dated Aug. 2, 2018", 3 pgs.
"U.S. Appl. No. 15/087,270, Final Office Action dated Jun. 27, 2017", 12 pgs.
"U.S. Appl. No. 15/087,270, Non Final Office Action dated Jan. 5, 2017", 12 pgs.
"U.S. Appl. No. 15/087,270, Non Final Office Action dated May 10, 2018", 10 pgs.
"U.S. Appl. No. 15/087,270, Notice of Allowance dated Oct. 29, 2018", 8 pgs.
"U.S. Appl. No. 15/087,270, Response filed Mar. 30, 2017 to Non Final Office Action dated Jan. 5, 2017", 5 pgs.
"U.S. Appl. No. 15/087,270, Response filed Jul. 20, 2017 to Final Office Action dated Jun. 27, 2017", 6 pgs.
"U.S. Appl. No. 15/087,270, Response filed Jul. 26, 2018 to Non Final Office Action dated May 10, 2018", 6 pgs.
"U.S. Appl. No. 15/087,270, Response filed Oct. 24, 2016 to Restriction Requirement dated Sep. 15, 2016", 7 pgs.
"U.S. Appl. No. 15/087,270, Restriction Requirement dated Sep. 15, 2016", 9 pgs.
"International Application Serial No. PCT/US2017/019689, International Search Report dated Jun. 7, 2017", 5 pgs.
"International Application Serial No. PCT/US2017/019689, Written Opinion dated Jun. 7, 2017", 6 pgs.
"International Application Serial No. PCT/US2017/019689, International Preliminary Report on Patentability dated Oct. 11, 2018", 8 pgs.

* cited by examiner

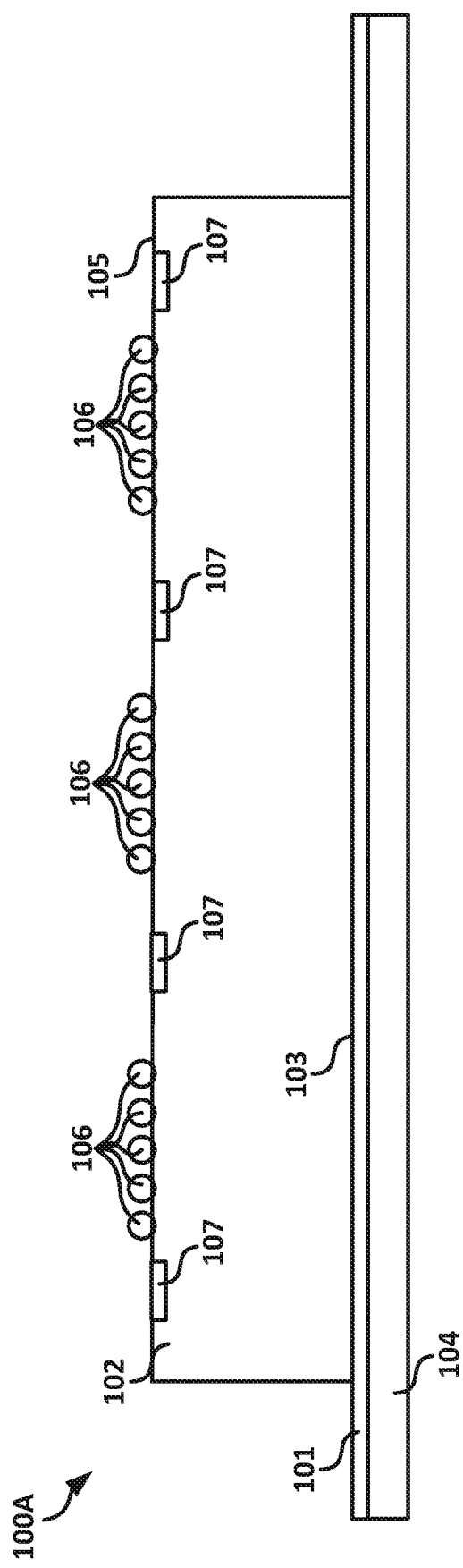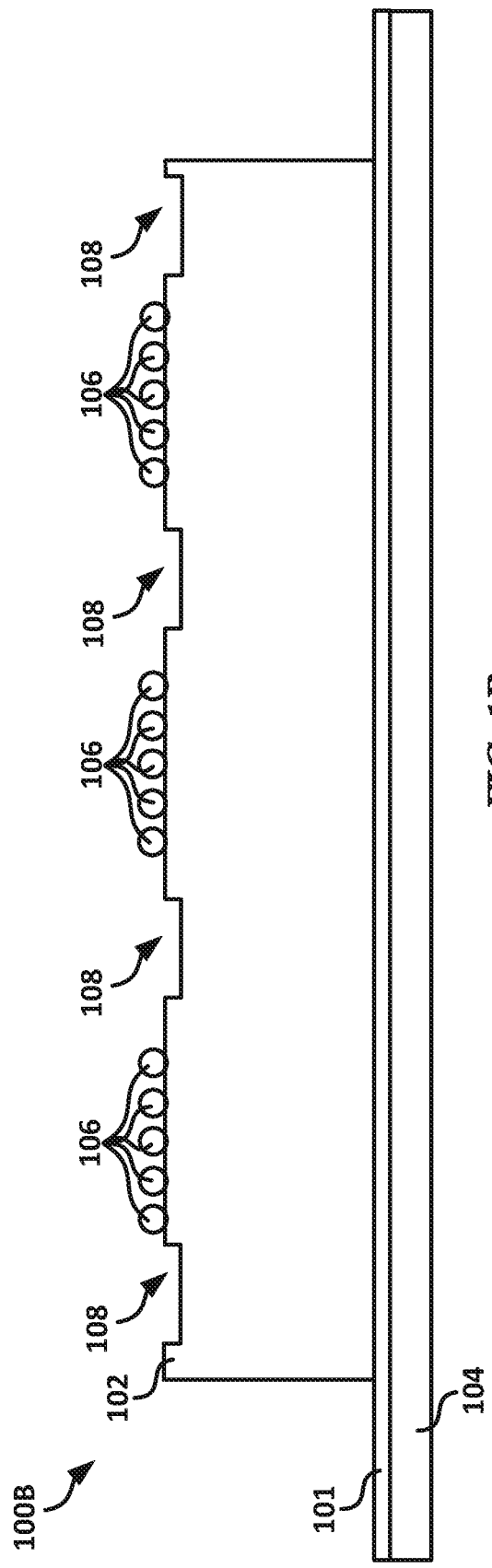
FIG. 1A
FIG. 1B

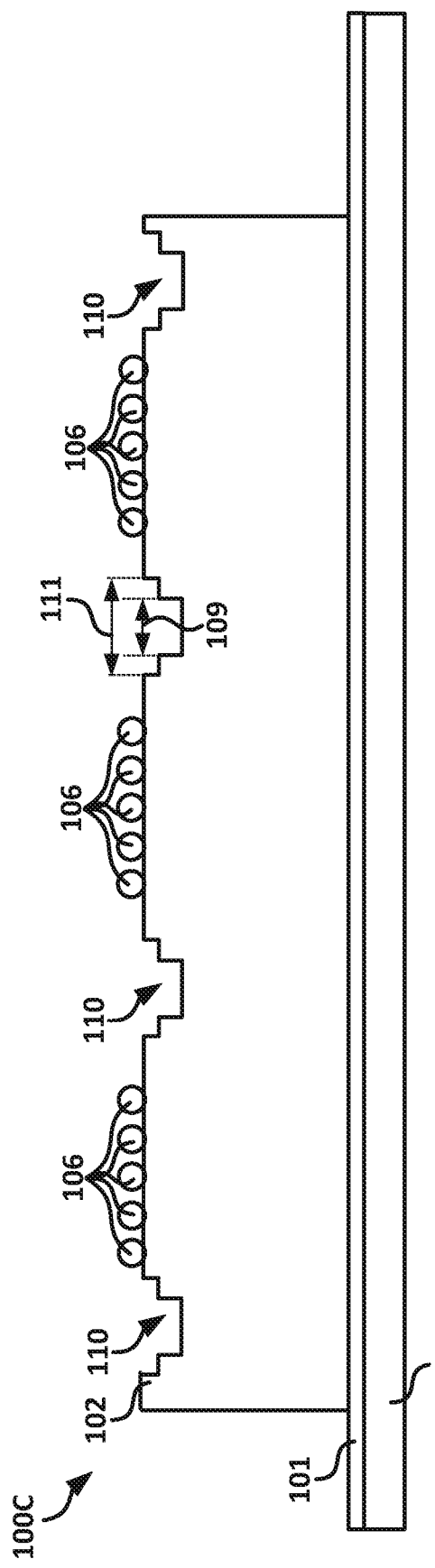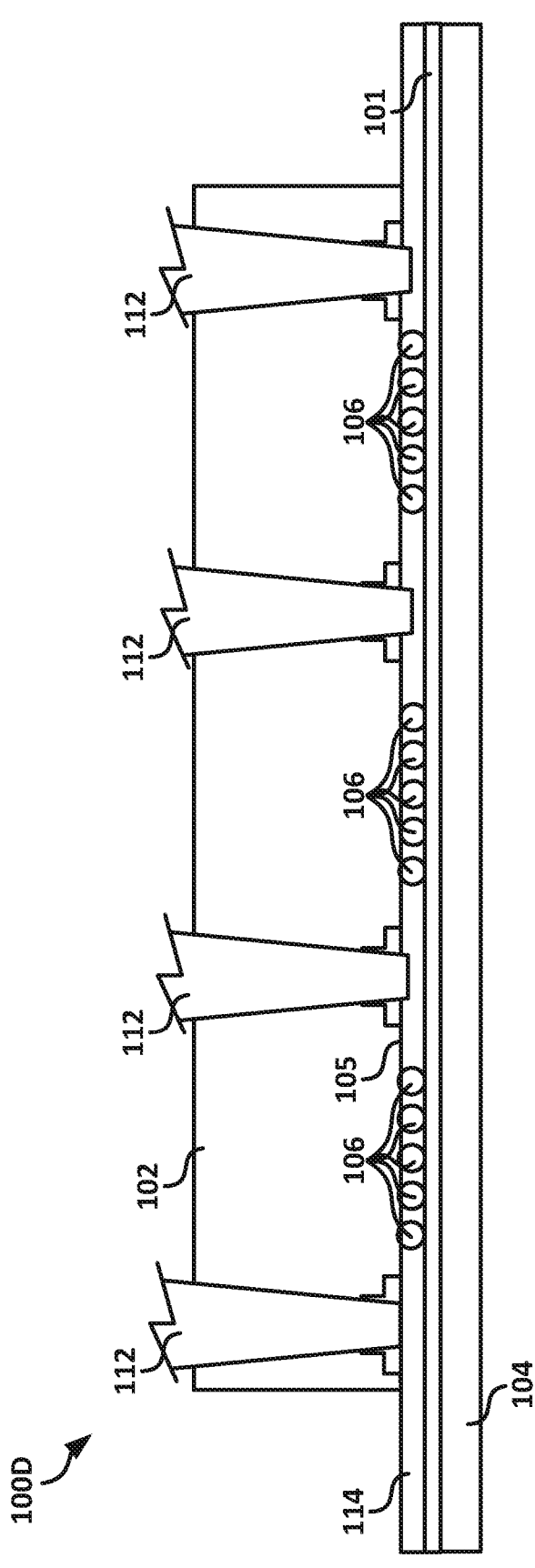

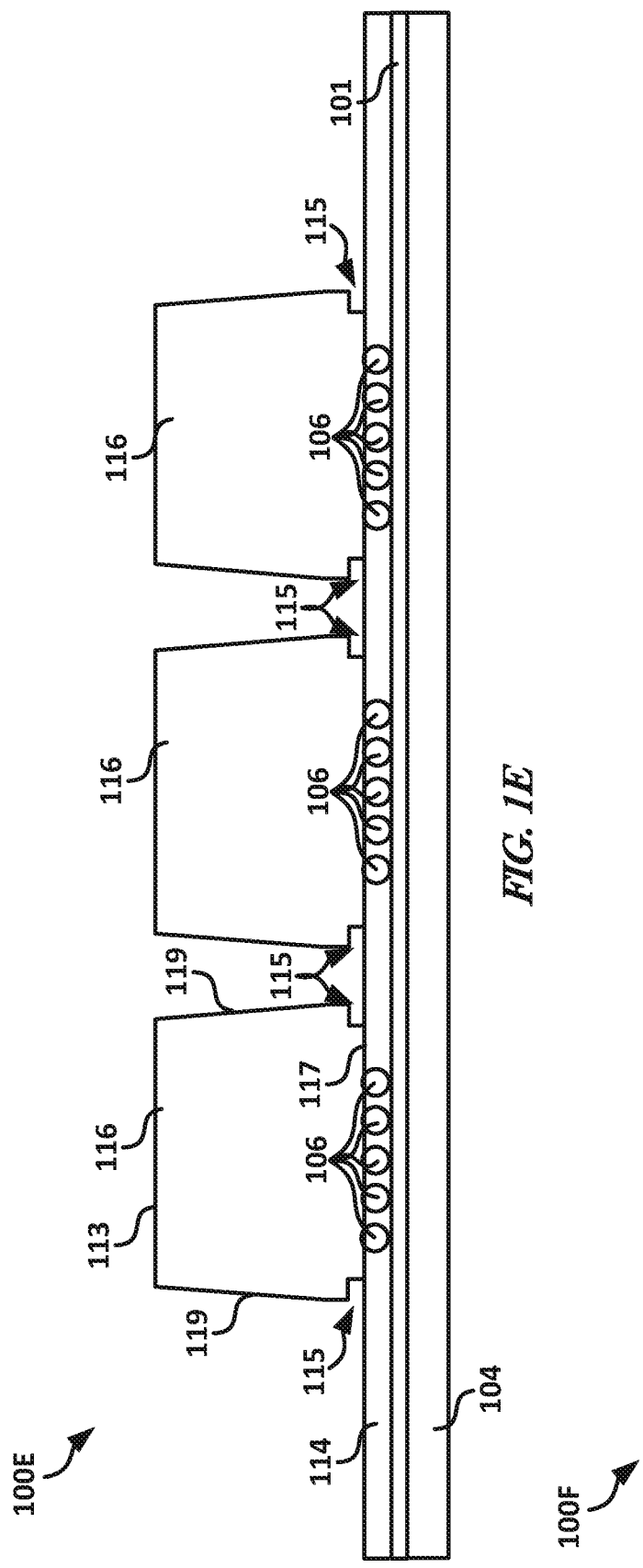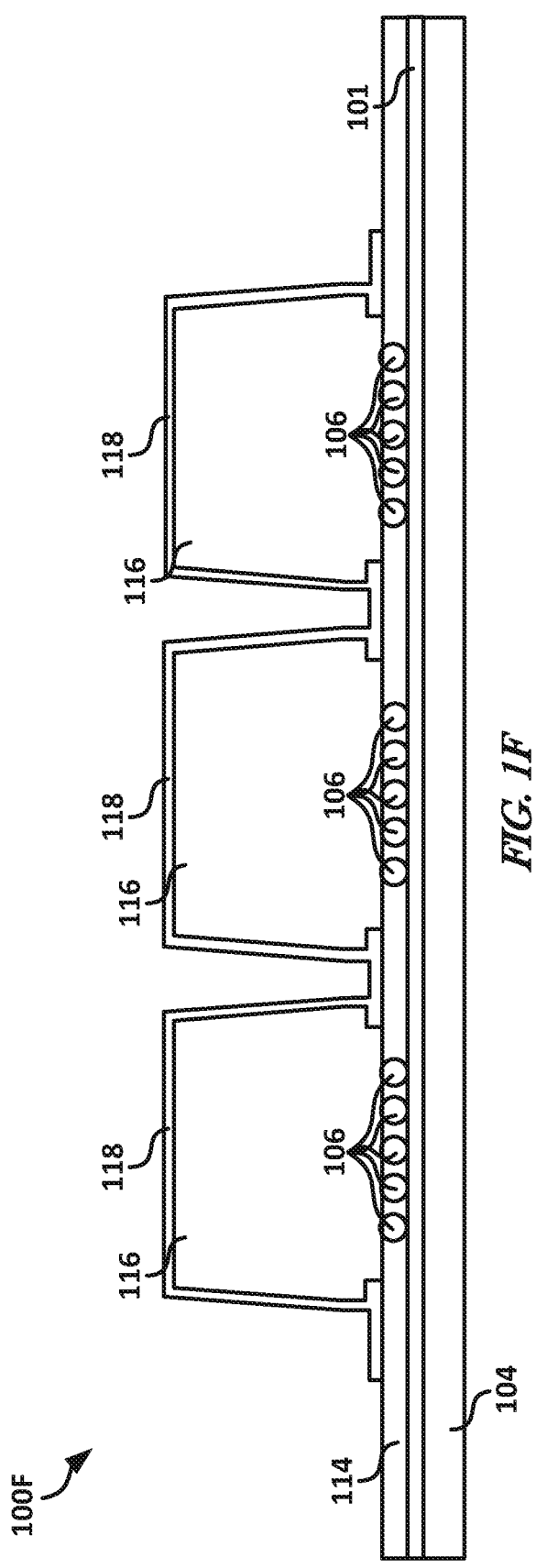

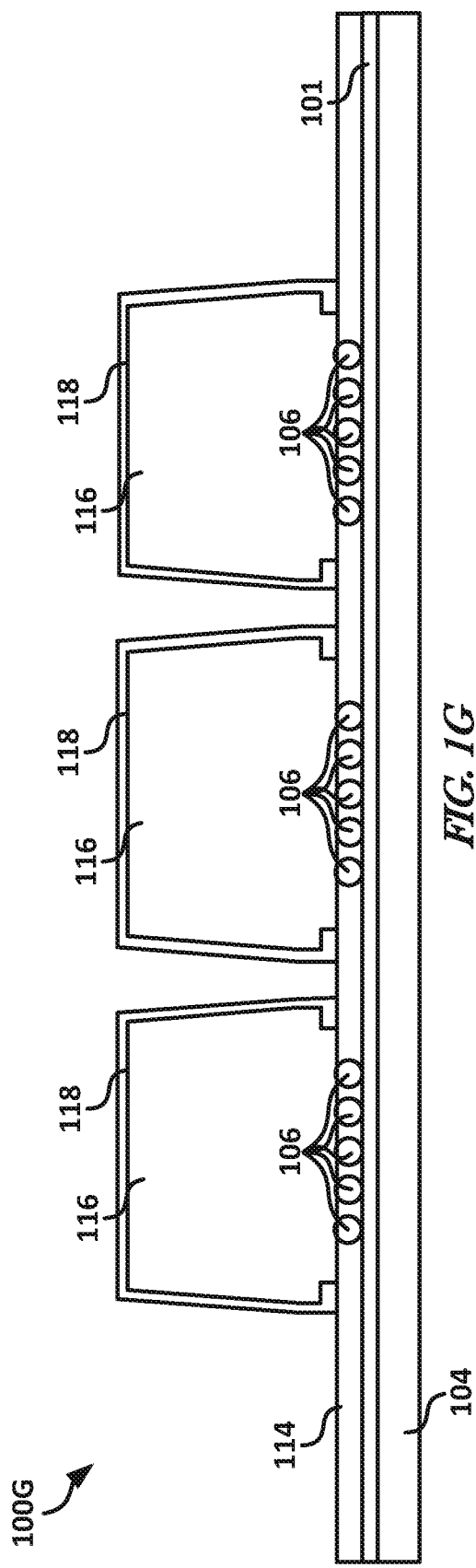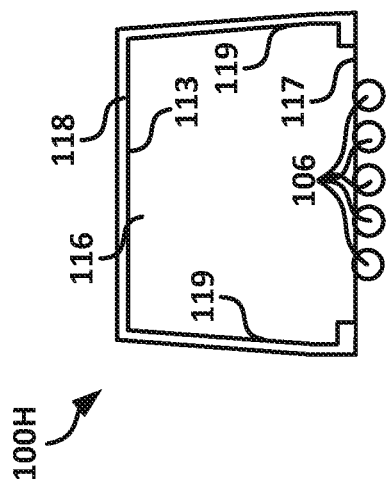

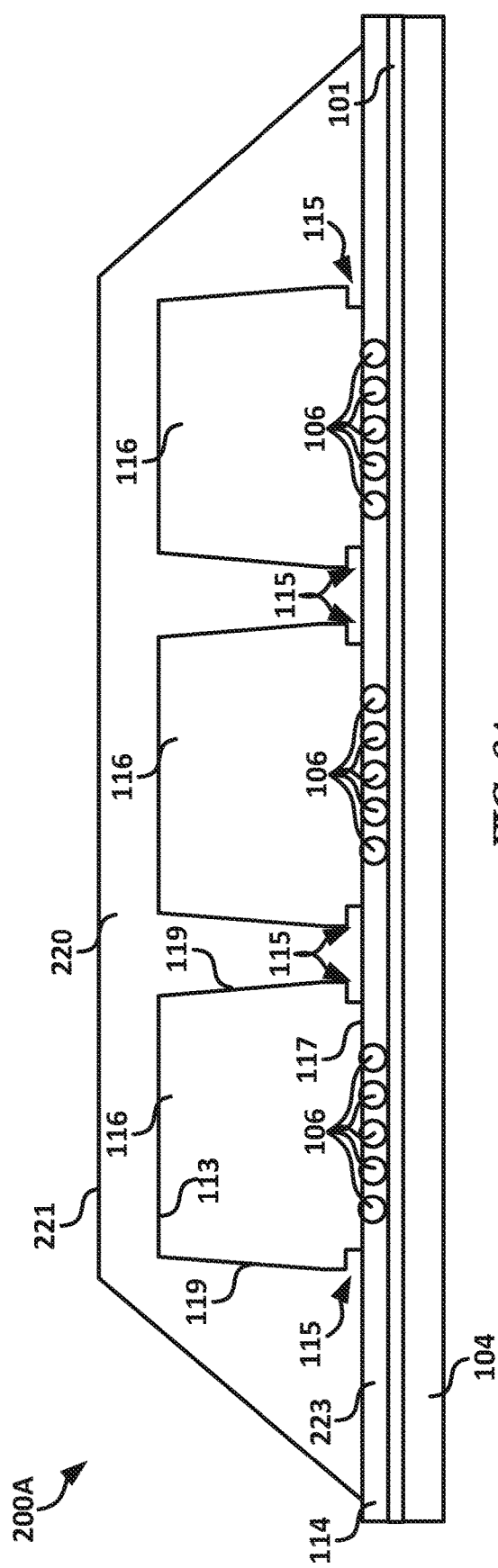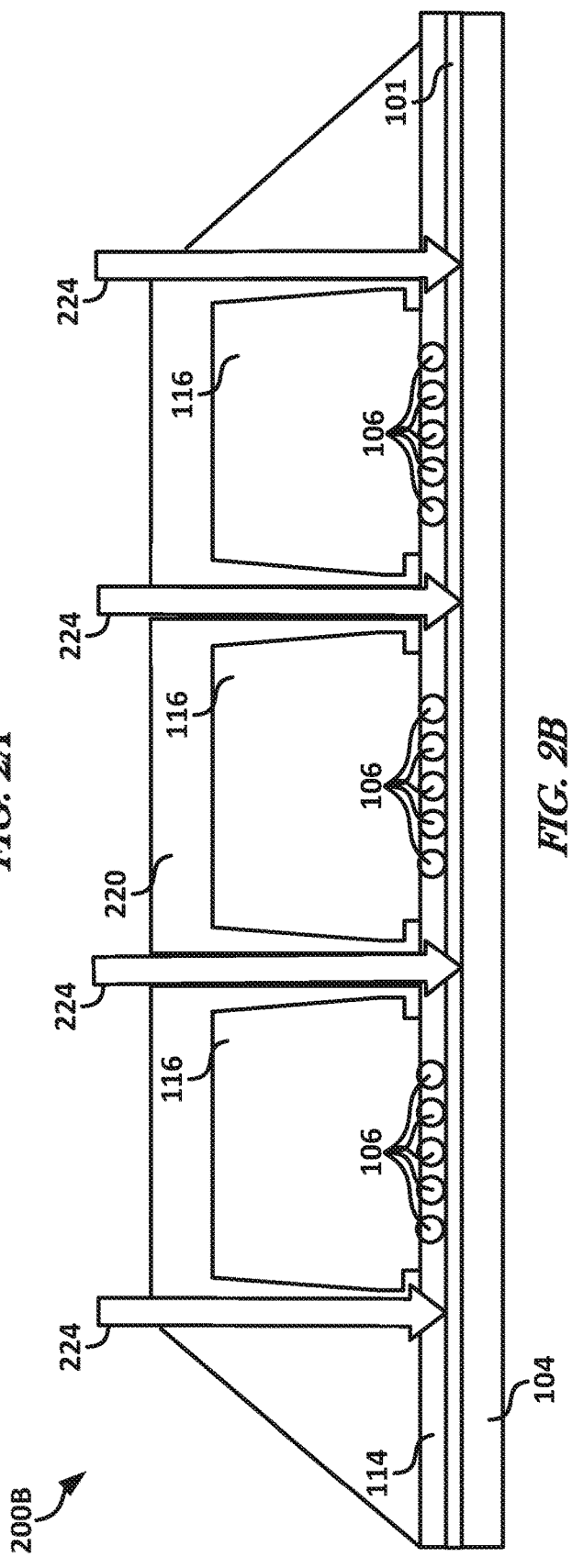

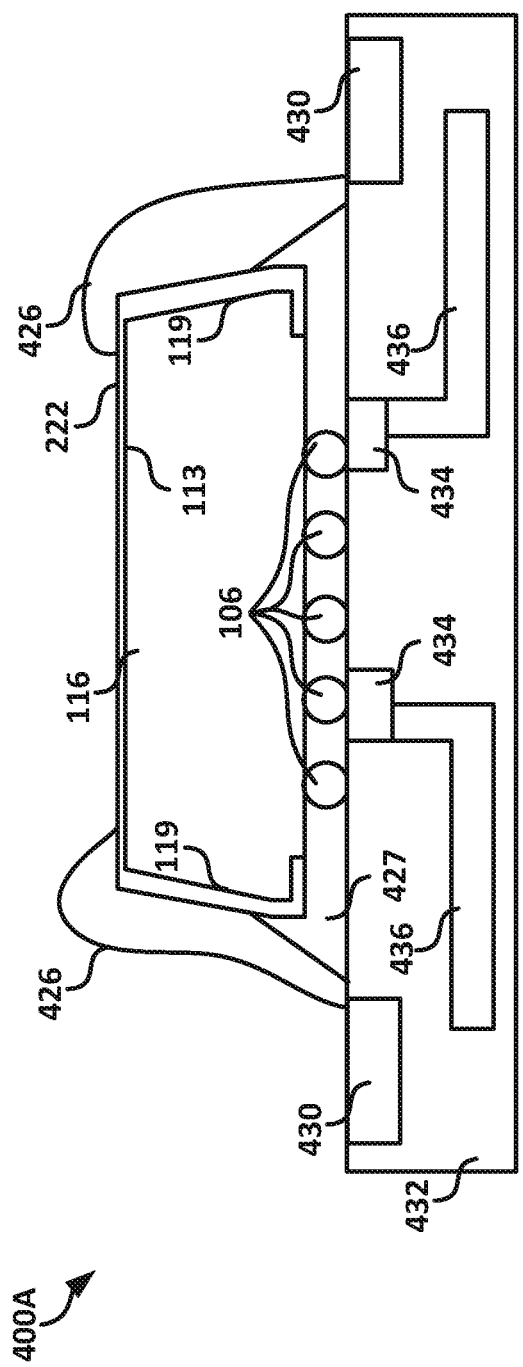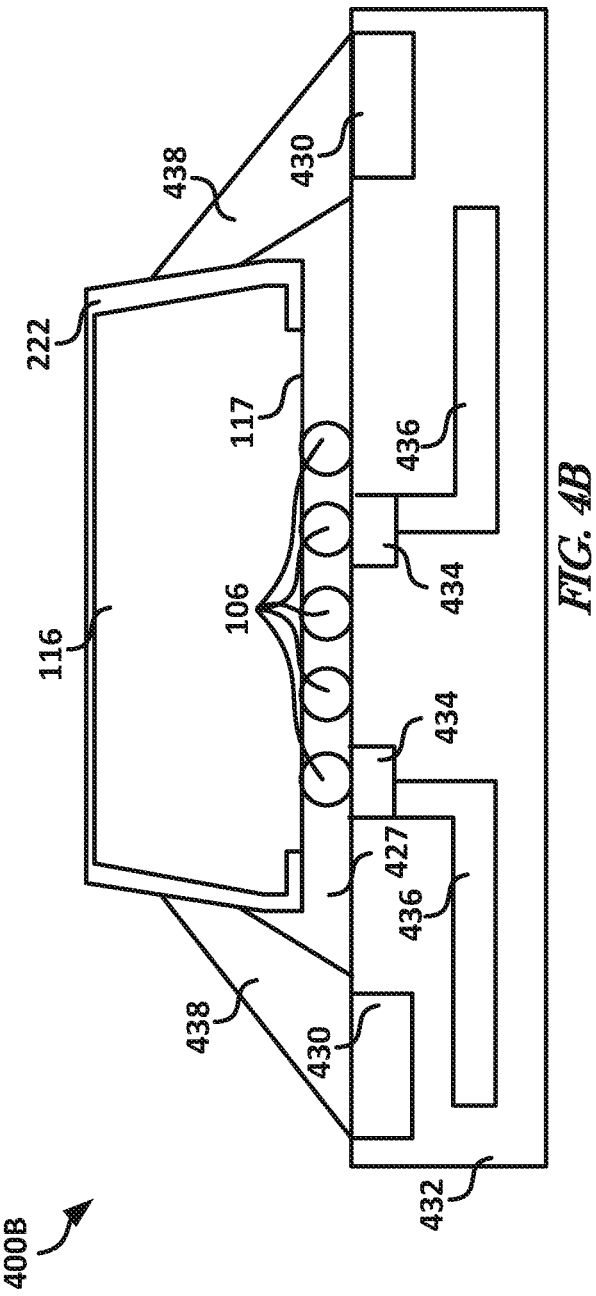

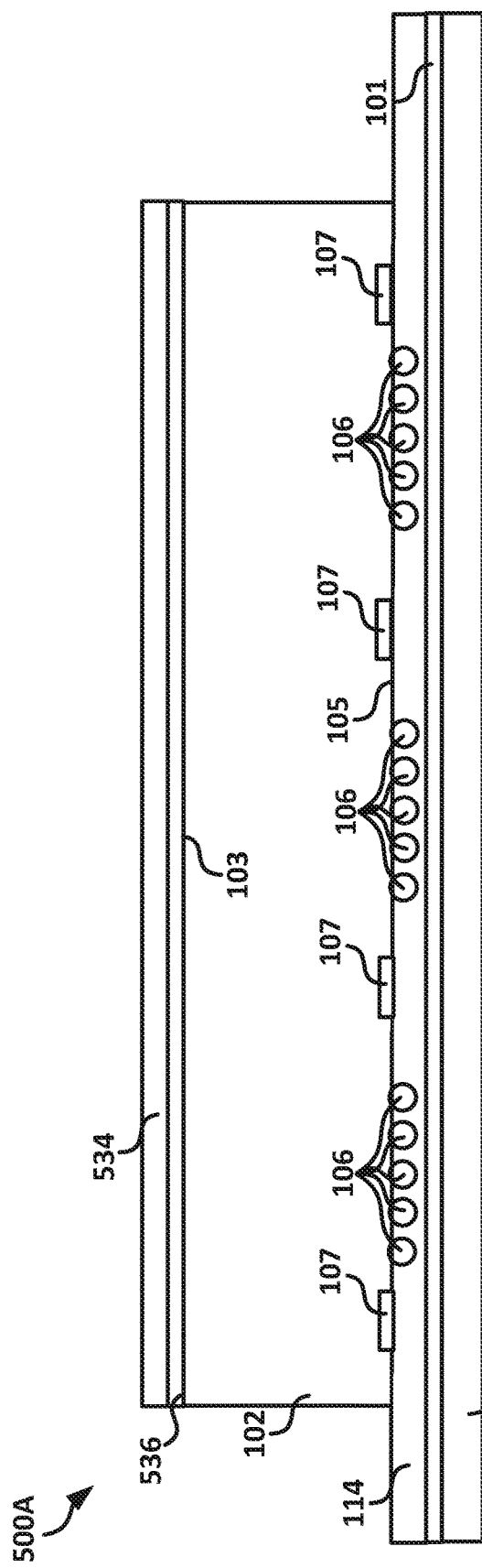
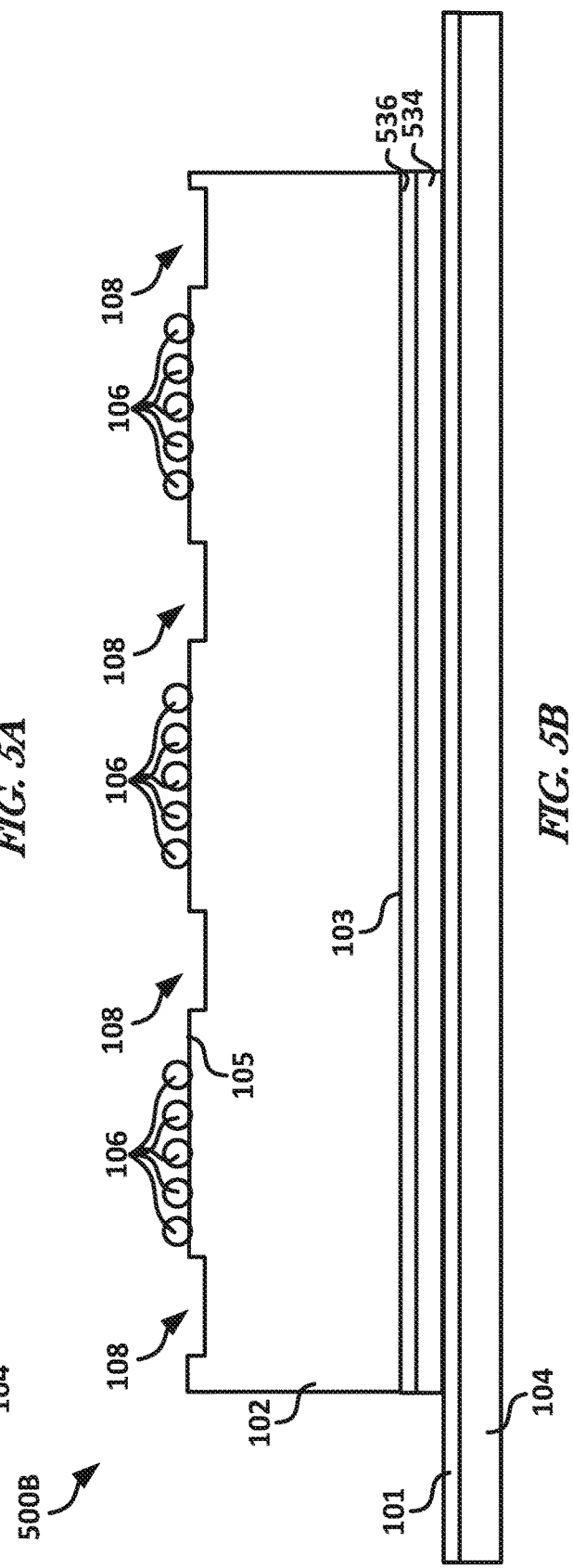

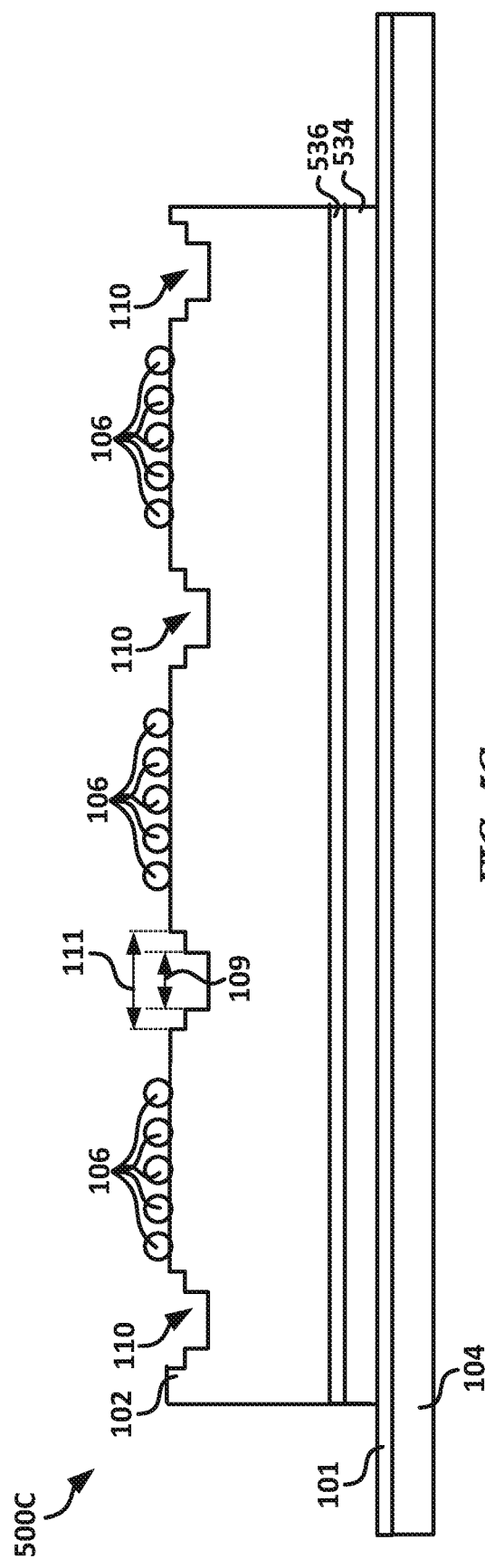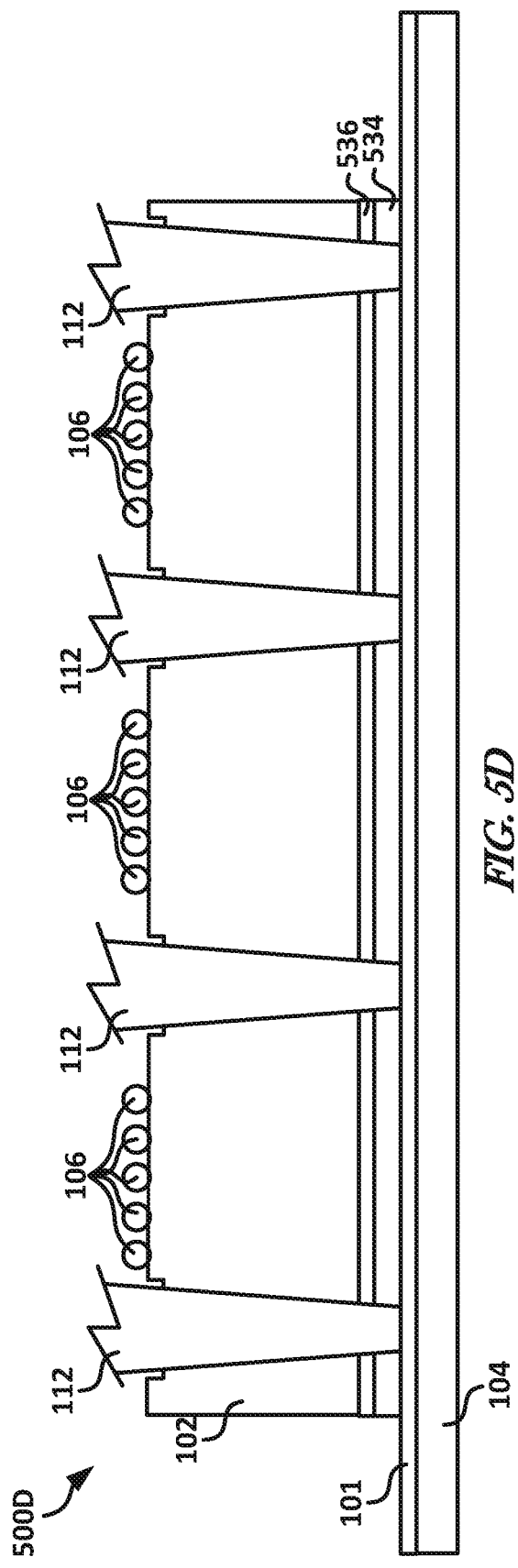

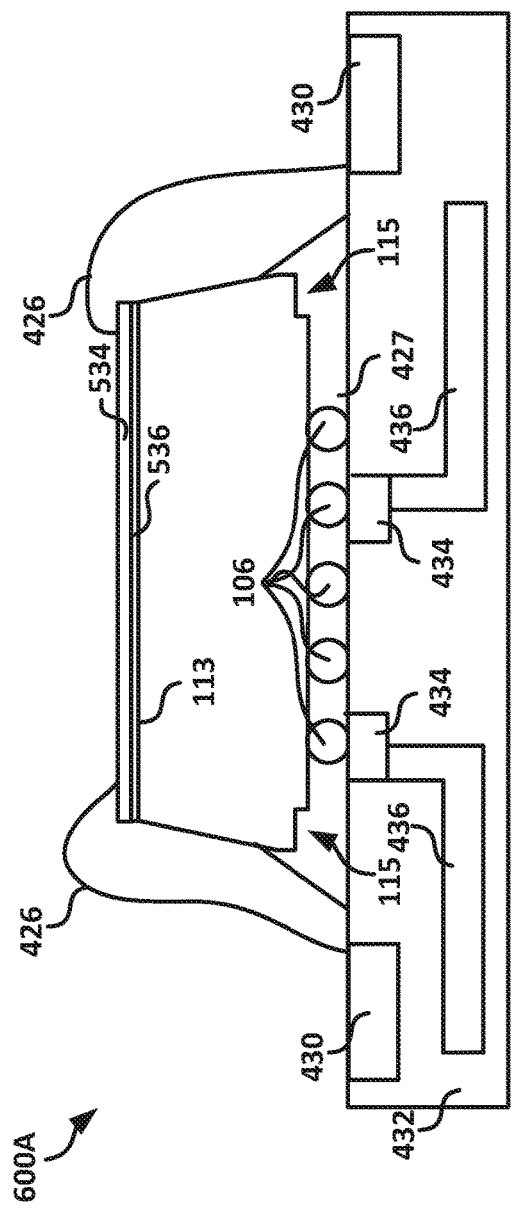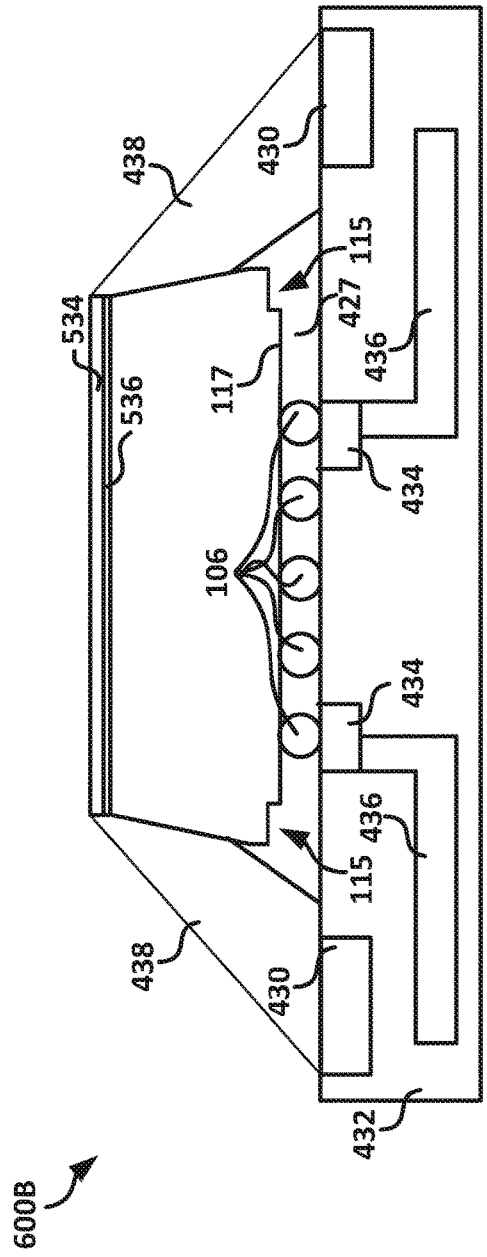

SYSTEMS AND METHODS FOR ELECTROMAGNETIC INTERFERENCE SHIELDING

CROSS-REFERENCE TO RELATED APPLICATION

This application is a continuation of U.S. patent application Ser. No. 15/087,270, filed Mar. 31, 2016, which is incorporated by reference herein in its entirety.

TECHNICAL FIELD

This disclosure relates generally to electromagnetic interference (EMI) shielding. One or more embodiments regard a manufacturing process to provide an EMI shielding for an electronics package. One or more embodiments regard the EMI shielded packages produced using one of the manufacturing processes.

BACKGROUND ART

Electromagnetic sources can generate electrical signals that can cause Electromagnetic interference (EMI). EMI is an electromagnetic wave or signal generated by an external source that negatively affects a circuit. The electromagnetic wave or signal can affect the circuit through electromagnetic induction, electrostatic coupling, and/or conduction. The electromagnetic wave can degrade the performance of the circuit or even stop it from functioning.

BRIEF DESCRIPTION OF THE DRAWINGS

FIGS. 1A-1G illustrate, by way of example, cross-section diagrams of an embodiment of a process for manufacturing a device with EMI shielding.

FIG. 1H illustrates, by way of example, a cross section diagram of an embodiment of a package created using a process discussed with regard to FIGS. 1A-1G.

FIGS. 2A-2B illustrate, by way of example, cross-section diagrams of another embodiment of a process for manufacturing a device with EMI shielding.

FIGS. 4A-4B illustrate, by way of example, cross-section diagrams of another embodiment of a process for manufacturing a die package with EMI shielding.

FIGS. 5A-5D illustrate, by way of example, cross-section diagrams of an embodiment of another process for manufacturing a device with EMI shielding.

FIG. 6A illustrates, by way of example, a cross-section diagram of an embodiment of a system that includes a device (e.g., a device made using a process of FIGS. 5A-5D) electrically coupled to ground pads of the substrate.

FIG. 6B illustrates, by way of example, a cross-section diagram of an embodiment of another system similar to the system of FIG. 6A.

DESCRIPTION OF EMBODIMENTS

Figure 3A:
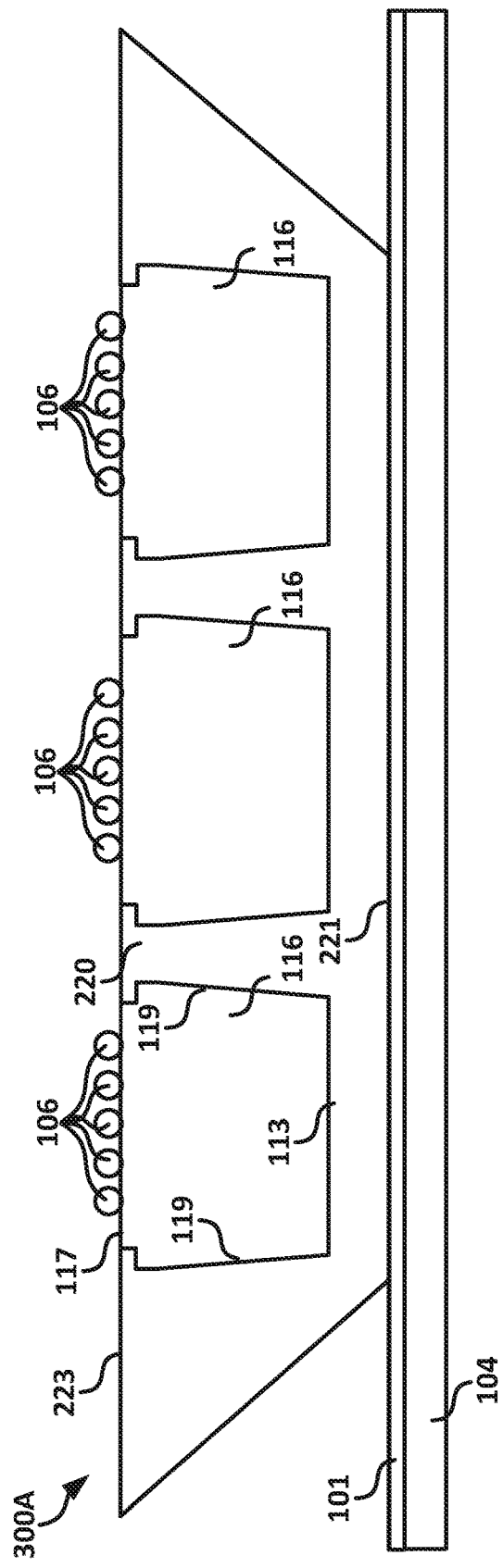
FIGS. 3A-3B illustrate, by way of example, cross-section diagrams of another embodiment of a process for manufacturing a device with EMI shielding.

The following description and the drawings sufficiently illustrate embodiments to enable those skilled in the art to practice them. Other embodiments can incorporate structural, logical, electrical, process, or other changes. Portions and features of some embodiments can be included in, or substituted for, those of other embodiments. Embodiments set forth in the claims encompass all available equivalents of those claims.

Embodiments discussed herein provide EMI shielding for an electronic package, such as a molded or unmolded system in package (SiP). Generally a metal foil or film is formed on and/or around the SiP such that the metal foil or film contacts ground circuitry (e.g., one or more ground pads, vias, traces, ground planes, or the like electrically connected to an electrical ground, on or at least partially in a surface of a substrate of the package).

An EMI shielding for an electronics package (e.g., a molded or unmolded system in package (SiP)) uses a physical vapor deposition (PVD) sputtering process to coat a mold surface with a conductive material. Another EMI shielding for an electronics package includes a metal can over the packaged device. Current physical shields and molded packages increase a footprint of the SiP. The sputtering process has some disadvantages, such as high cost of the sputtering equipment, increase in throughput time to increase sputtered conductive material thickness, complex process for uniform material coverage on package sidewalls, and mold surface pre clean to improve adhesion, among others. Using EMI shielding between components, laser trenches are made between components and filled with a conductive material. This laser trenching is performed using an expensive laser ablation process that adversely impacts cost and throughput time for manufacturing.

In one or more embodiments, individual die are EMI shielded by coating a conductive material (e.g., a foil or film of conductive material) on or over a die backside and die sidewalls. In one or more embodiments, the coating can be applied after die singulation at the wafer level. In one or more embodiments, individual or multiple dice can be flip-chip assembled on a package. In one or more embodiments, the assembled multi-chip package can be molded. One or more dice can then be connected to ground circuitry on, or at least partially in, the package substrate, such as by wire bonding or by conductive paste, for example.

EMI shielding the die backside and sidewalls reduces the SiP footprint (x-y direction, parallel to plane defined by die backside) and thickness (z direction, perpendicular to plane defined by die backside), such as to allow multiple EMI shielded dice to be more closely spaced in a package without interfering with each other electrically. Such shielding does not require molding and then sputter coating. Such shielding does not require an expensive laser ablation tool and long laser trench process time, such as is used when multiple components need to be shielded from one another. The use of a conductive foil, such as stainless steel, on the die backside for EMI shielding can also be designed as a stiffener to control package warpage.

The manufacturing processes discussed herein can provide one or more advantages over prior EMI shielding techniques and/or devices with EMI shielding. An advantage can include avoiding sputtering and the relatively high costs associated therewith. Another advantage can include a reduced throughput time as compared to a sputtering process.

A "foil" as used herein is a conductor, such as a substantially pure metal. A "film" as used herein is a combination of a dielectric material (e.g., an organic material) and a conductive material attached to each other. The remaining discussion refers to foils. However, it is to be understood that a film can be used in place of a foil.

EMI shielding by applying a conductive material to the die backside and/or sidewalls is applicable to flip chip, wire bonded, stacked, and/or embedded devices. Typical process flow operations and typical materials that can be used are described below and illustrated in the figures. However, the process flows are not limited to the listed materials and operations.

Using a film or foil in place of a sputtered material as described with regard to the preceding FIGS. provides a more robust (e.g., stronger, harder to break or penetrate, more reliable, or the like) EMI shielding. Unlike with sputtering material, a wider variety of metal and/or alloy compositions can be used. Using a film or foil, the thickness of the EMI shielding is not limited like it is using a sputtered material. The foil or film is generally denser and has fewer defects, such as voids, cracks, or other defects. Such defects can be detected using a microscope or inspection by the naked eye. The foil or film generally has a more uniform thickness over a curved surface as compared to a sputtered material. Such differences make the foil or film as discussed herein physically different from a sputtered material. Such differences can be detected by the naked eye or with the aid of a microscope.

FIGS. 1A-1G illustrate, by way of example, cross-section diagrams of an embodiment of a method for forming a die package with EMI shielding. FIG. 1A illustrates, by way of example, a cross-section diagram of a system 100A. The system 100A, as illustrated, includes a wafer 102, a wafer support 104, interconnection circuitry 106, and metallization 107 between electronic devices of the wafer 102.

The wafer 102 can be thinned down to a desired thickness, such as by using a wafer grind process, for example. The wafer includes a backside 103 and an active side 105. The active side 105 is opposite the backside 103. The active side 105 is the side through which electrical signals can be received from the die. A wafer is sometimes referred to as a slice of a substrate. Generally a wafer is made of a semi-conductor material, such as silicon. The wafer 102 is the medium in and/or on which an electronic device can be built. The wafer can be doped, etched, subject to deposition (or other technique) of conductive and/or dielectric material(s), and/or patterning of the materials. Electronic device(s) are singulated from the wafer 102 and packaged (described elsewhere herein).

The wafer support 104 can be a rigid material. The wafer support 104 can include silicon, metal, and/or glass, among other rigid materials. A tacky material 101 (e.g., an adhesive) can be coated or otherwise situated on the wafer support 104. The tacky material 101 can include a thermal release tape, thermoplastic, polyimide adhesive film, Polyvinyl chloride (PVC) film, pressure sensitive acrylic based adhesive, ultra-violet (UV) release film, and/or a polyester based adhesive, among others. Objects can be coupled to the wafer support 104 through the tacky material 101.

Devices on a wafer are separated by areas called "streets" (analogous to a street around a home), referred to herein as the metallization 107. The top surface of the street area is usually populated with test and alignment features that contain metal (usually Cu, Al) conductors embedded in dielectric material. This material is generally removed by a laser ablation (sometimes called laser scribe) method prior to singulation of the die from the wafer 102.

FIG. 1B illustrates, by way of example, a cross-section diagram of an embodiment of a system 100B that includes the system 100A after metallization 107 between active die regions is removed. Removal of the metallization 107 leaves a void 108, sometimes referred to as a trench, where the metallization 107 and/or portions of the wafer 102 were removed. The metallization 107 can be removed using a laser scribe, plasma etching, ion etching, mechanical saw, and/or mechanical abrasion process, in one or more embodiments.

FIG. 1C illustrates, by way of example, a cross-section diagram of an embodiment of a system 100C that includes the system 100B after a cut (sometimes called "Z1") into the void 108. The cut creates a deeper void 110 in at least a portion of the void 108. The void 110, sometimes referred to as a trench, can be narrower in width than the void 108 (as indicated by arrows 109 and 111, respectively.

FIG. 1D illustrates, by way of example, a cross-section diagram of an embodiment of a system 100D that includes the system 100C with the interconnection circuitry 106 on another wafer support 114. The system 100C is flipped over onto the wafer support 114 such that the interconnection 106 is in contact with the wafer support 114, as shown in FIG. 1D.

The wafer support 114 is a material that provides an area on which the interconnection circuitry 106 can be placed, such as without slipping or damaging the interconnection circuitry 106. The wafer support 114 can include an elastomeric material (e.g., a silicone, rubber, or the like), such as to help cushion the wafer 102.

The system 100D includes a saw 112 singulating individual devices from the wafer 102. The saw 112 can include a bevel saw. The saw 112 cuts all the way through the wafer 102 or at least partially into the wafer support 114. The saw 112 can be situated in the void(s) 108 and/or 110. The saw 112 can cut through the portion of the wafer 102 remaining between the void 110 and the active side 105. The saw 112 singulates individual dies 116 (see FIG. 1E) from the wafer 102.

FIG. 1E illustrates, by way of example, a cross-section diagram of an embodiment of a system 100E that includes the dies 116 singulated from one another. The dies 116 each include an optional undercut 115. The undercut 115 can be an artifact of removing the metallization 107 (i.e. part of the void 110 remaining after the singulation with the saw 112). The undercut 115 can be removed by modulating the width of the cut created to remove the metallization 107 to be less than or equal to a width of the saw 112 at the point where the saw 112 cuts the wafer 102 near the void 108.

FIG. 1F illustrates, by way of example, a cross-section diagram of an embodiment of a system 100F that includes the system 100E after a conductive material 118 is coated on the die backside 113 and/or sidewalls 119. The conductive material 118 can include one or more of titanium, chromium, tungsten, nickel, vanadium, platinum, palladium, cobalt, silver, gold, or a combination thereof, among others. Titanium, titanium-tungsten, and/or chromium in the conductive material 118 can help improve conductive material adhesion to the die 116. Nickel-vanadium, nickel, platinum, palladium, and/or cobalt in the conductive material 118 can help improve a diffusion barrier between the conductive material 118 and the die 116. Silver and/or platinum in the conductive material 118 can help improve conductive material resistance to oxidation.

The conductive material 118 can at least partially fill the undercut 115, in one or more embodiments. In such embodiments, conductive material 118 is on the active side 117 of the die 116. The conductive material 118 can be coated on the die backside 113 and/or sidewalls 119 (see FIG. 1E)

using a sputtering, spray coating, plating, paste printing, and/or roller coating process, among others.

FIG. 1G illustrates, by way of example, a cross-section diagram of an embodiment of a system 100G that includes the system 100F after conductive material 118 between dice 116 is removed. Such conductive material removal singulates the dice 116 from each other and/or electrically isolates the dice 116 from each other. The conductive material 118 between the dice 116 can be removed using a laser ablation, chemical etching, ion etching, mechanical particle abrasion, and/or saw process, among others. The devices can be removed from the wafer support 114, such as to be assembled in a package (see FIGS. 4A and 4B, for example).

FIG. 1H illustrates, by way of example, a cross-section diagram of an embodiment of a device 100H produced using a process as described with regard to FIGS. 1A-G. The device 100H as illustrated includes a die 116 with the conductive material 118 adhered directly to the die 116. The conductive material 118 as illustrated covers a die backside 113 and sidewalls 119. The conductive material 118 also covers other sides of the die 116 that are not shown in the cross-section. The conductive material 118 is illustrated as filling the undercut 115. The interconnection circuitry 106 are electrically coupled to connection circuitry (e.g., one or more pad(s), via(s), bus(es) trace(s), or the like) of the die 116.

FIG. 2A illustrates, by way of example, a cross-section diagram of an embodiment of a system 200A that includes the system 100E after a conductive paste 220 is situated on and/or around the dies 116. The conductive paste 220 can include a polymer. The polymer can include conductive particles mixed therein. The conductive particles can include one or more of metallic particles, magnetic particles, carbon particles, and/or graphite particles, or the like. The conductive paste 220, in one or more embodiments, can be coated on the die backside 113, sidewalls 119, and/or in the undercut 115. The conductive paste 220 can be applied by print, screen, spray or other coating technique(s). The conductive paste 220 can be exposed to heat, such as to cure the conductive paste 220.

FIG. 2B illustrates, by way of example, a cross-section diagram of an embodiment of a system 200B that includes the system 200A with the conductive paste 220 being cut (indicated by the arrows 224) using laser ablation or a saw. The cut can singulate the dies 116 from each other. The device produced can be removed from the wafer support 114 and can be assembled into a package (see FIGS. 4A-4B, for example). The resultant device is similar to the device 100H with the conductive material 118 being a conductive paste instead of a sputtered conductive material.

FIG. 3A illustrates, by way of example, a cross-section diagram of an embodiment of a system 300A that includes the system 200A after the cured conductive paste 220 and dies 116 are flipped and coupled to the wafer support 104, such as through the tacky material 101. A top surface 221 of the conductive paste 220 is in contact with the wafer support 104. A bottom surface 223 of the conductive paste 220 faces away from the wafer support 104.

Figure 3B:
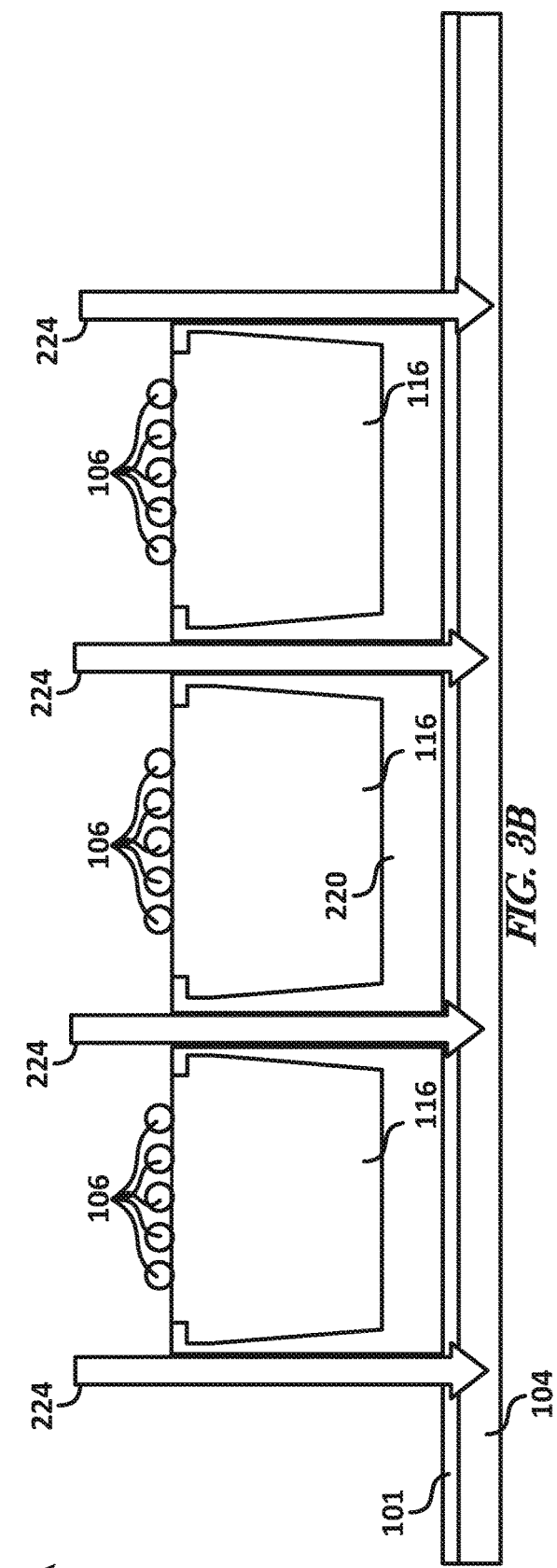

FIG. 3B illustrates, by way of example, a cross-section diagram of an embodiment of a system 300B that includes the system 300A being cut, such as to singulate dies 116 from one another. The cut can be through the cured conductive paste 220 to the wafer support 104. The cut can performed using the saw 224, a laser, or other cutting device. Cutting from the bottom surface 223 to the top surface 221 as shown in FIG. 39 can help position the cutting tool (e.g., saw 224) more precisely between devices 116 as compared to cutting from the top surface 221 to the bottom surface 223 as shown in FIG. 2B. This cut is sometimes referred to as a Z1 cut. The resultant device is similar to the device 100H with the conductive material 118 being a conductive paste instead of a sputtered conductive material.

FIG. 4A illustrates, by way of example, a cross-section diagram of an embodiment of a system 400A that includes a device (e.g., a device made using the process of FIGS. 1A-1G, 2A-2B, and/or 3A-3B) electrically coupled to connection circuitry 434 of a substrate 432. The system 400A as illustrated includes a device 116 with a conductive material 222 (e.g., a sputtered conductive material 118 or conductive paste 220) over five sides thereof (a top surface 113 and four side surfaces 119). The device 116 includes the connectors 106 electrically coupled to pads 434 and other connection circuitry 436 (vias, buses, or the like). The substrate 432 can be a bumpless buildup layer (BBUL) substrate, such as can include a plurality of buildup layers (e.g., Ajinomoto buildup layers), laminated material including glass fiber, such as can include FR4 or FR5 material.

The system 400A as illustrated further includes a molding material 427 between the interconnection circuitry 106 and/or around the die 116, such as on the conductive material 222. The molding material 427 is an insulating material (i.e. a dielectric), such as can include epoxy resins that are thermoplastic or thermosets, such as cresol novolac or bisphenol. Additionally or alternatively, the molding material 427 can include inorganic filler, catalyst, flame retardant, stress modifier, and/or an adhesion promoter, among others. The conductive material 222 is connected to a ground pad 430 (a pad electrically coupled to electrical ground) and/or other ground circuitry through a wire 426. The wire 426 is electrically coupled to the conductive material 222 and the ground pad 430, such as to connect the conductive material 222 to electrical ground. Such a configuration makes the conductive material 222 act as an EMI shield for the die 116. Alternatively, tape bonding the conductive material 422 to the ground pad 430 can be used in place of the wire bonding shown in FIG. 4A.

FIG. 4B illustrates, by way of example, a cross-section diagram of an embodiment of another system 400B. The system 400B is similar to the system 400A with the system 400B including a conductive paste 438 (similar to the conductive paste 220) electrically coupling the conductive material 222 to the ground pad 430 and/or other ground circuitry, rather than the wire 426 as in the system 400A. The system 400B can be created by flip chip, wire bond, or stacked die attaching the interconnection circuitry 106 to pads 434. The molding material 427 can then be situated around the connections 106, the bottom surface 117, and/or the conductive material 222 around the bottom surface 117. The conductive paste 438 can be deposited using a syringe dispense method, in one or more embodiments.

FIG. 5A illustrates, by way of example, a cross-section diagram of an embodiment of a system 500A. The system 500A as illustrated includes the wafer 102, interconnection circuitry 106, wafer supports 104 and 114, an adhesive 536, and a conductive foil 534.

The bottom surface 105 of the wafer 102 faces the wafer support 114 and the active surface 103 of the wafer 102 faces away from the wafer support 114. The wafer 102 is attached to the wafer support 114, such as to protect the interconnection circuitry 106. In one or more embodiments, the adhesive 536 can be laminated on the top surface 103 of the wafer 102 without the conductive foil 534. In one or more embodiments, the adhesive 536 and the conductive foil 534 can be laminated together on the top surface 103 of the wafer 102. The conductive foil 534 and adhesive 536 can be laminated on the wafer 102 after the wafer 102 is attached to the wafer support 114.

The adhesive 536 can include a thermal plastic or other adhesive. Example adhesives include glue(s), pressure sensitive adhesives, spray adhesives, fabric adhesives, epoxy, and polyurethane, among others.

The conductive foil 534 can include copper, nickel coated copper, or tin coated copper, or the like. Such materials can be easily connected to the ground pads 430 (see FIGS. 6A-6B) by wire bonding. The foil 534 can include a conductive material, such as copper, aluminum, gold, titanium, silver, stainless steel, a laminate conductive material, or a combination thereof, among others. A film, which can be used in place of the foil 534, can include a foil attached to another layer of material, such as can include an organic material, such as polypropylene, polyethylene terephthalate, and/or polyethylene, among others. The organic material of the film can be chosen for its bonding characteristics (its ability to be attached to the wafer 102 using the adhesive 536). Such configurations are beneficial when the foil 534 alone does not bond well to the wafer 102. In one or more embodiments, the conductive foil 534 can include stainless steel. The stiffness of a stainless steel (or a material with a similar stiffness) can help reduce package warpage.

FIG. 5B illustrates, by way of example, a cross-section diagram of an embodiment of a system 500B that includes the system 500A after flipping the wafer 102 and creating the void 108. The system 500A can be removed from the wafer support 114, flipped over, and attached to the wafer support 104. Flipping the wafer 102 puts the conductive foil 534 on the wafer support 104. The top surface 103 of the wafer faces the wafer support 104. The bottom surface 105 of the wafer 102 faces away from the wafer support 104.

The void 108 is created by removing metallization 107 between dies on the wafer 102, such as is discussed with regard to FIG. 1B. The difference in FIG. 5B is that the conductive foil 534 is on the wafer support 104 while in FIG. 1B, the system 100B does not include the conductive foil 534 or the adhesive 536 and the top surface 103 of the wafer 102 is on the wafer support 104.

FIG. 5C illustrates, by way of example, a cross-section diagram of an embodiment of a system 500C that includes the system 500B after a cut (sometimes called "Z1") into the void 108. The cut creates a deeper void 110 in at least a portion of the void 108. The void 110 can be narrower in width than the void 108 (as indicated by arrows 109 and 111, respectively).

Figure 5E:
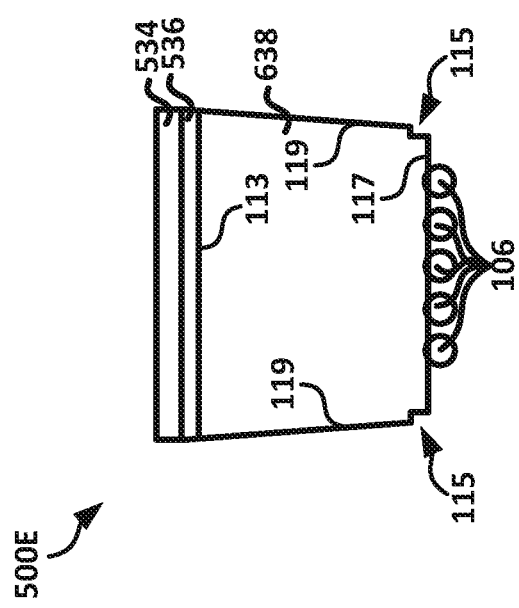
FIG. 5E illustrates, by way of example, a cross section diagram of an embodiment of a package created using a process discussed with regard to FIGS. 5A-5D.

FIG. 5D illustrates, by way of example, a cross-section diagram of an embodiment of a system 500D that includes the system 500C with a saw 112 singulating individual devices from the wafer 102. The saw 112 can include a bevel saw. The saw 112 cuts all the way through the wafer 102 or at least partially into the wafer support 104. The saw 112 can be situated to cut in the void(s) 108 and/or 110. The saw 112 can cut through the portion of the wafer 102 remaining between the void 110 and the active side 105. The saw 112 singulates individual dies 638 (see FIG. 5E) from the wafer 102.

FIG. 5E illustrates, by way of example, a cross-section diagram of a device 500E produced using a process as described with regard to FIGS. 5A-5D. The device 500E as illustrated includes a die 638 with the conductive foil 534 adhered to the top surface 113 of the die 638 using the adhesive 536. The conductive foil 534 as illustrated covers the die backside 113 and does not cover any of the sidewalls 119. The undercut 115 (a byproduct of crating the void 108 by removing the metallization between dies) is not filled with conductive material in the embodiment shown. The interconnection circuitry 106 can be electrically coupled to connection circuitry (e.g., one or more pad(s), via(s), bus(es) trace(s), or the like) of the die 638.

FIG. 6A illustrates, by way of example, a cross-section diagram of an embodiment of a system 600A that includes a device (e.g., a device made using a process of FIGS. 5A-5D) electrically coupled to ground pads 430 and/or other ground-connected connection circuitry of the substrate 432. The system 600A as illustrated includes the device 638 with the conductive foil 534 on only a top surface 113 of the device 638. The device 116 includes the connectors 106 electrically coupled to pads 434 and other connection circuitry 436 (vias, buses, or the like).

The system 600A as illustrated further includes the molding material 427 between the interconnection circuitry 106, on the substrate 432, and/or around the die 116, such as in the undercut 115. The molding material 427, in one or more embodiments, fills the undercut 115. The conductive foil 534 is connected to a ground pad 430 (a pad electrically coupled to electrical ground) through the wire 426. The wire 426 is electrically coupled to the conductive foil 534 and the ground pad 430 and/or other ground-connected connection circuitry, such as to connect the conductive foil 534 to electrical ground. Such a configuration makes the conductive foil 534 act as an EMI shield for the die 638. Alternatively, tape bonding the conductive foil 534 to the grounding pad 430 can be used in place of wire bonding.

FIG. 6B illustrates, by way of example, a cross-section diagram of an embodiment of another system 600B. The system 600B is similar to the system 600A with the system 600B including a conductive paste 438 (similar to the conductive paste 220) electrically coupling the conductive foil 534 to the ground pad 430 (rather than the wire 426 as shown in FIG. 6A). The system 600B can be created by flip chip attaching (or other method of attaching) the interconnection circuitry 106 to pads 434. The molding material 427 can then be situated around the connections 106, the bottom surface 117, on the substrate 432, and/or the in the undercut 115. The conductive paste 438 can be deposited using a syringe dispense method, in one or more embodiments.

A singulation (e.g., a die singulation or material removal that results in die separation physically and or electrically) that is performed using a laser produces a different physical structure than one that is performed using a saw process. The saw process leaves sides of dies (for example) beveled, while a laser singulation process leaves sides of dies less beveled as compared to the saw process. Both of the processes leave sides that are generally perpendicular to a major plane defined by a surface of the die backside. However, an angle formed between the side and the die backside using the saw process is less than an angle formed between the side and the die backside using the laser process. Additionally, the laser process leaves a different grain structure on the sides of the dies as compared to the saw process. This difference is detectable under a microscope and sometimes even by feeling the die. The saw process generally leaves a more bumpy side, while the laser process leaves a smoother side.

Figure 7:
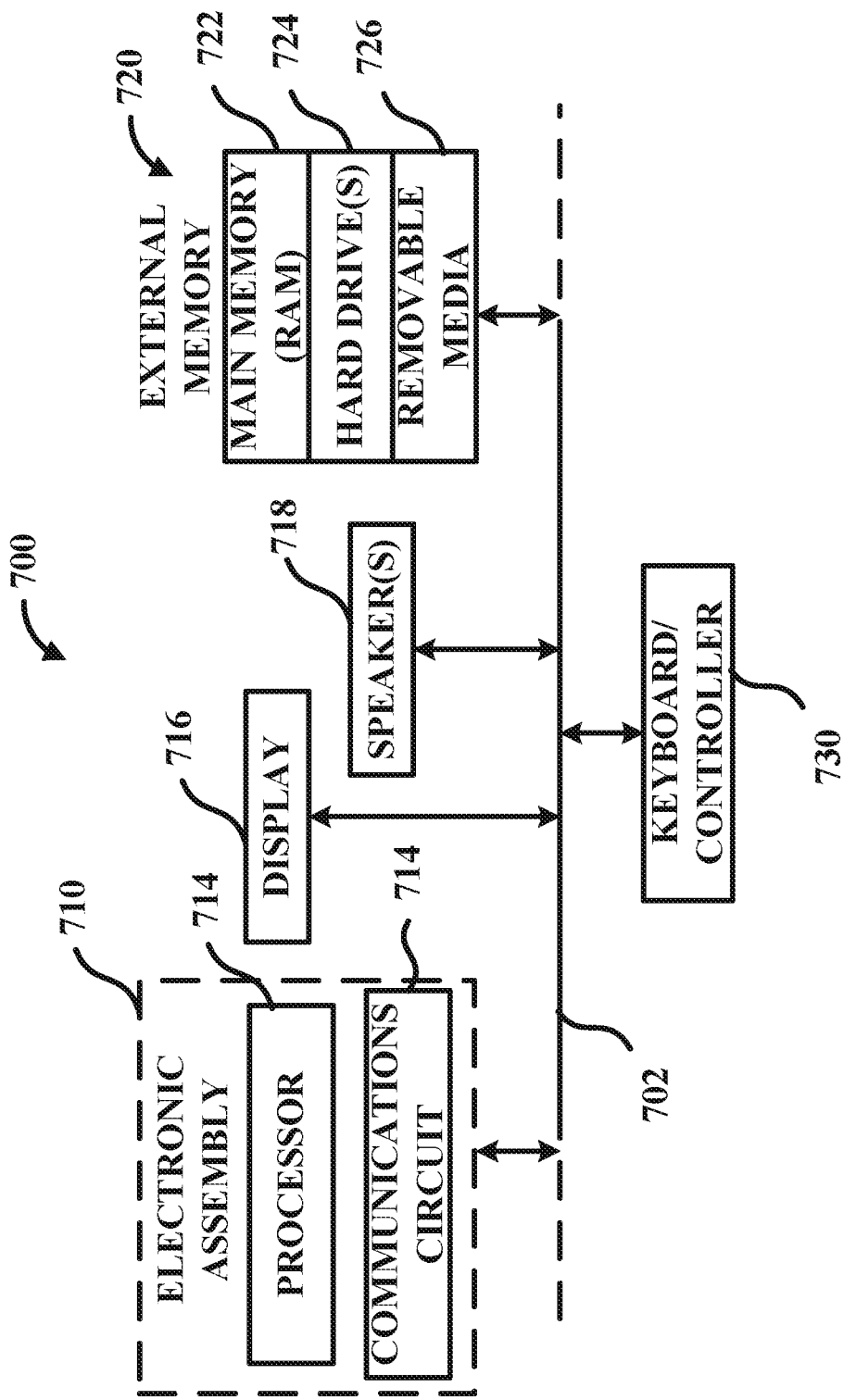
FIG. 7 illustrates, by way of example, a cross-section diagram of an embodiment of an electronic device which can include an EMI shielding as disclosed herein.

FIG. 7 shows a block diagram example of an electronic device which can include an EMI shielding as disclosed herein. An example of an electronic device using one or more packages with one or more higher resistance via is included to show an example of a device application for the present disclosure. Electronic device 700 is merely one example of a device in which embodiments of the present disclosure can be used. Examples of electronic devices 700 include, but are not limited to, personal computers, tablet computers, supercomputers, servers, telecommunications switches, routers, mobile telephones, personal data assistants, MP3 or other digital music players, radios, or the like.

In the example of FIG. 7, electronic device 700 comprises a data processing system that includes a system bus 702 to couple the various components of the system. System bus 702 provides communications links among the various components of the electronic device 700 and can be implemented as a single bus, as a combination of busses, or in any other suitable manner.

An electronic assembly 710 is coupled to system bus 702. The electronic assembly 710 can include a circuit or combination of circuits. In one embodiment, the electronic assembly 710 includes a processor 712 which can be of any type. As used herein, "processor" means any type of computational circuit, such as but not limited to a microprocessor, a microcontroller, a complex instruction set computing (CISC) microprocessor, a reduced instruction set computing (RISC) microprocessor, a very long instruction word (VLIW) microprocessor, a graphics processor, a digital signal processor (DSP), multiple core processor, or any other type of processor or processing circuit.

Other types of circuits that can be included in electronic assembly 710 are a custom circuit, an application-specific integrated circuit (ASIC), or the like, such as, for example, one or more circuits (such as a communications circuit 714) for use in wireless devices like mobile telephones, pagers, personal data assistants, portable computers, two-way radios, and similar electronic systems. The IC can perform any other type of function.

The electronic device 700 can include an external memory 720, which in turn can include one or more memory elements suitable to the particular application, such as a main memory 722 in the form of random access memory (RAM), one or more hard drives 724, and/or one or more drives that handle removable media 726 such as compact disks (CD), digital video disk (DVD), and the like.

The electronic device 700 can also include a display device 716, one or more speakers 718, and a keyboard and/or controller 730, which can include a mouse, trackball, touch screen, voice-recognition device, or any other device that permits a system user to input information into and receive information from the electronic device 700.

Additional Notes and Examples

In Example 1 a device with electromagnetic interference (EMI) shielding can include a substrate including electrical connection circuitry therein, grounding circuitry on, or at least partially in the substrate, the grounding circuitry at least partially exposed by a surface of the substrate, a die electrically connected to the connection circuitry and the grounding circuitry, the die on the substrate, a conductive material on a die backside, and a conductive paste or one or more wires electrically connected to the grounding circuitry and the conductive material.

In Example 2 the device of Example 1 can include one or more undercuts on an active side of the die, the active side facing the substrate and opposite the die backside.

In Example 3 the device of Example 2 can include, wherein the conductive material is a sputtered conductor or a conductive paste, the conductive material is directly on the die backside, and wherein the conductive material fills the one or more undercuts.

In Example 4 the device of Example 3 can include, wherein the conductive material covers the die backside, covers four sides of the die generally perpendicular to a plane defined by the die backside, and partially covers an active side of the die, the active side of the die opposite the die backside.

In Example 5 the device of Example 1 can include, wherein the conductive material includes a conductive film or conductive foil only on the die backside and the device further comprises an adhesive directly on the die backside adhering the conductive film or conductive foil to the die backside.

In Example 6 the device of at least one of Example 1-5 can include, wherein the grounding circuitry is one or more ground pads on or at partially in the substrate, each of the ground pads electrically coupled to logical ground of the substrate.

In Example 7 the device of at least one of Examples 1-6 can include one or more solder balls electrically and mechanically connected to the active side of the die and the electrical connection circuitry of the substrate.

In Example 8 the device of at least one of Examples 1-7 can include, wherein the conductive paste or one or more wires is the conductive paste.

In Example 9 the device of at least one of Examples 1-7 can include, wherein the conductive paste or one or more wires is the one or more wires.

In Example 10 the device of at least one of Examples 1-9 can include a molding material situated on the substrate, on an active surface of the die, on conductive material on the active surface of the die, and on conductive material on the sides of the die.

In Example 11 a method for providing electromagnetic interference (EMI) shielding for a die can include removing metallization between dies of a wafer of dies to create a first trench in the wafer, cutting into the first trench to create a deeper trench in the first trench, singulating dies from the wafer by cutting the wafer at locations corresponding to the first trench and the deeper trench, sputtering a conductive material or depositing a conductive paste over the dies to cover a die backside and four sides of each of the dies, and singulating the dies by removing conductive material between the dies or cutting through the conductive paste to a wafer support.

In Example 12 the method of Example 11 can include, wherein sputtering a conductive material or depositing a conductive paste over the dies to cover a die backside and four sides of each of the dies is depositing the conductive paste over the dies to cover a die backside and four sides of each of the dies.

In Example 13 the method of Example 11 can include, wherein sputtering a conductive material or depositing a conductive paste over the dies to cover a die backside and four sides of each of the dies is sputtering a conductive material over the dies to cover a die backside and four sides of each of the dies.

In Example 14 the method of at least one of Examples 11-13 can include, wherein singulating dies from the wafer by cutting the wafer at locations corresponding to the first trench and the deeper trench includes singulating the dies from the wafer such that the first trench forms one or more undercuts on an active side of the die, the active side of the die opposite the die backside and facing the substrate, and wherein sputtering a conductive material or depositing a conductive paste over the dies to cover a die backside and four sides of each of the dies includes filling the one or more undercuts with the conductive material or conductive paste.

In Example 15 the method of at least one of Examples 11-14 can include attaching the singulated die to a substrate including electrically connecting a ground pad on or at least partially in the substrate to the conductive material or conductive paste using a wire or conductive paste.

In Example 16 the method of Example 15 can include injecting a molding material between the substrate and the active side of the die.

In Example 17 the method of Example 16 can include, wherein injecting the molding material includes injecting the molding material to be in contact with the conductive material or conductive paste on an active side of the die and two or more sides of the die that are generally perpendicular to a major plane of the active surface of the die, and on an a surface of the substrate facing the active side of the die.

In Example 18 the method of Example 16 can include, wherein sputtering a conductive material or depositing a conductive paste over the dies to cover a die backside and four sides of each of the dies is depositing the conductive paste over the dies to cover a die backside and four sides of each of the dies and the method further comprises curing the deposited conductive paste.

In Example 19 the method of Example 18 can include flipping the devices with cured conductive paste, and prior to singulating the dies from the wafer, attaching the flipped devices to a wafer support so that the active side of the dies face away from the wafer support.

In Example 20 a method for providing electromagnetic interference (EMI) shielding for a die can include adhering, using an adhesive, a conductive foil or conductive film to a backside of a wafer of dies, after attaching the conductive foil or conductive film, removing metallization on an active side of the wafer and between dies of the wafer of dies to create a first trench in the wafer, the active side of the wafer opposite the backside of the wafer, cutting into the first trench to create a deeper trench in the first trench, and singulating dies from the wafer by cutting the wafer at locations corresponding to the first trench and the deeper trench.

In Example 21 the method of Example 20 can include after attaching the conductive foil or conductive film and before removing the metallization, attaching the wafer of dies to a wafer support such that the conductive foil is in contact with the wafer support.

In Example 22 the method of at least one of Examples 20-21 can include, wherein singulating dies from the wafer by cutting the wafer at locations corresponding to the first trench and the deeper trench includes singulating the dies from the wafer such that the first trench forms one or more undercuts on the active side of the die.

In Example 23 the method of at least one of Examples 20-22 can include attaching the singulated die to a substrate including electrically connecting a ground pad on or at least partially in the substrate to the conductive material or conductive paste using a wire or conductive paste.

In Example 24 the method of Example 23 can include injecting a molding material between the substrate and the active side of the die.

In Example 25 the method of Example 24 can include, wherein injecting the molding material includes injecting the molding material to be in contact with the conductive material or conductive paste on an active side of the die and two or more sides of the die that are generally perpendicular to a major plane of the active surface of the die, and on an a surface of the substrate facing the active side of the die.

The above description of embodiments includes references to the accompanying drawings, which form a part of the description of embodiments. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The above description is intended to be illustrative, and not restrictive. For example, the above-described examples (or one or more aspects thereof) can be used in combination with each other. Other embodiments can be used such as by one of ordinary skill in the art upon reviewing the above description. The Abstract is provided to allow the reader to quickly ascertain the nature of the technical disclosure. It is submitted with the understanding that it will not be used to interpret or limit the scope or meaning of the claims. Also, in the above description of embodiments, various features can be grouped together to streamline the disclosure. This should not be interpreted as intending that an unclaimed disclosed feature is essential to any claim. Rather, inventive subject matter can lie in less than all features of a particular disclosed embodiment. Thus, the following claims are hereby incorporated into the description of embodiments, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

What is claimed is:

1. A device with electromagnetic interference (EMI) shielding, the device comprising:
    a substrate including electrical connection circuitry therein;
    ground circuitry on, or at least partially in, the substrate;
    a die electrically connected to the electrical connection circuitry and the ground circuitry, the die on the substrate;
    a conductive foil, conductive film, or conductive paste on and covering a die backside and one or more outer side surfaces of the die, and partially covering an active side of the die, the active side of the die opposite the die backside, the sides of the die extending between the active side and the die backside;

one or more undercuts forming a void on the active side and an outer side surface of the outer side surfaces of the die, the active side interfacing with the substrate; and wherein the conductive foil, conductive film, or conductive paste fills the one or more undercuts.

2. The device of claim 1, wherein the ground circuitry is at least partially exposed by a surface of the substrate.

3. The device of claim 1, wherein the conductive foil, conductive film, or conductive paste is a conductive foil or conductive film and the device further comprises a second conductive paste or one or more wires electrically connected to the ground circuitry and the conductive foil or the conductive film.

4. The device of claim 3, wherein the conductive foil or conductive film is a sputtered conductor or a conductive paste.

5. The device of claim 3, wherein the second conductive paste or one or more wires is the second conductive paste.

6. The device of claim 3, wherein the second conductive paste or one or more wires is the one or more wires.

7. The device of claim 1, wherein the conductive foil, conductive film, or conductive paste is directly on the die backside.

8. The device of claim 1, wherein the ground circuitry includes one or more ground pads on or at partially in the substrate, each of the ground pads electrically coupled to logical ground of the substrate.

9. The device of claim 1, further comprising one or more solder balls electrically and mechanically connected to the active side of the die and the electrical connection circuitry of the substrate.

10. The device of claim 1, further comprising a molding material situated on the substrate, on an active surface of the die, on the conductive foil, the conductive film, or the conductive paste on the active surface of the die, and on the conductive foil, the conductive film, or the conductive paste on the one or more sides of the die.

11. The device of claim 1, wherein the conductive foil or conductive film is a discrete, continuous conductive foil, conductive film, or conductive paste.

12. The device of claim 1, wherein the conductive foil, the conductive film, or the conductive paste covers two or more sides of the die.

13. The device of claim 1, wherein the conductive foil, the conductive film, or the conductive paste covers three or more sides of the die.

14. The device of claim 1, wherein the conductive foil, the conductive film, or the conductive paste includes a conductive paste including conductive material in a polymer.

15. A device with electromagnetic interference (EMI) shielding, the device comprising:
 a substrate;
 ground circuitry on, or at least partially in, the substrate;
 a die electrically connected to the ground circuitry;
 a conductive foil, conductive film, or conductive film on and covering a die backside and one or more outer side surfaces of the die, and partially covering an active side of the die, the active side of the die opposite the die backside, the outer side surfaces of the die extending between the active side and the die backside;
 one or more undercuts forming a void on an active side and an outer side surface of the outer side surfaces of the die, the active side interfacing with the substrate; and
 wherein the conductive foil, conductive film, or conductive paste at least partially fills the one or more undercuts.

16. The device of claim 15, wherein the ground circuitry is at least partially exposed by a surface of the substrate.

17. The device of claim 15, further comprising a second conductive paste or one or more wires electrically connected to the ground circuitry and the conductive foil, the conductive film, or the conductive paste.

18. The device of claim 15, wherein the conductive foil, the conductive film, or the conductive paste is a conductive paste including conductive material mixed in a polymer.

19. The device of claim 15, wherein the conductive foil, the conductive film, or the conductive paste is directly on the die backside.

20. The device of claim 15, further comprising a molding material situated on the substrate, on an active surface of the die, on the conductive foil, the conductive film, or the conductive paste on the active surface of the die, and on the conductive foil, the conductive film, or the conductive paste on the one or more outer side surfaces of the die.

* * * * *